United States Patent [19]
Johansson

[11] Patent Number: 5,736,416
[45] Date of Patent: Apr. 7, 1998

[54] FABRICATION PROCESS FOR MOSFET USING OBLIQUE ROTATION ION IMPLANTATION

[75] Inventor: Lars Johansson, Tokyo, Japan

[73] Assignee: NEC Corporation, Tokyo, Japan

[21] Appl. No.: 577,335

[22] Filed: Dec. 22, 1995

[30] Foreign Application Priority Data

Dec. 28, 1994 [JP] Japan .................................. 6-327910

[51] Int. Cl.$^6$ .................................................. H01L 21/265
[52] U.S. Cl. .................... 437/29; 437/35; 437/953
[58] Field of Search ..................... 437/35, 40, 41, 437/34, 57, 29, 953; 257/344

[56] References Cited

U.S. PATENT DOCUMENTS

| 3,734,787 | 5/1973 | Dhaka et al. | 437/98 |
| 5,270,226 | 12/1993 | Hori et al. | 437/35 |
| 5,340,756 | 8/1994 | Nagayasu | 437/34 |
| 5,362,982 | 11/1994 | Hirase et al. | 257/408 |
| 5,413,945 | 5/1995 | Chien et al. | 437/57 |
| 5,416,038 | 5/1995 | Hsue et al. | 437/34 |
| 5,532,508 | 7/1996 | Kaneko et al. | 257/344 |
| 5,538,909 | 7/1996 | Hsu | 437/35 |

FOREIGN PATENT DOCUMENTS

| 4033309 | 5/1991 | Germany . |
| 4101130 | 7/1991 | Germany . |
| 63-302562 | 12/1988 | Japan . |
| 3-262130 | 11/1991 | Japan . |
| 4-27132 | 1/1992 | Japan . |
| 5-145030 | 6/1993 | Japan . |
| 6-61438 | 3/1994 | Japan . |
| 07161825 | 6/1995 | Japan . |
| 5311506 | 6/1995 | Japan . |

OTHER PUBLICATIONS

S. Odanaka et al., "A New Half–Micron p–Channel MOSFET with Efficient Punchthrough Stops", VLSI Symposium 1985, pp. 62–63 Month Unknown.

T. Hori et al., "Deep–Submicrometer Large–Angle Tilt Implanted Drain (LATID) Technology", *IEEE Transactions on Electron Devices*, vol. 39, No. 10, Oct. 1992, pp. 2312–2324.

T. Hori, "A New p–Channel MOSFET with Large–Tile–Angle Implanted Punchthrough Stopper (LATIPS)", *IEEE Electron Devices Letters*, vol. 9, No. 12, Dec. 1988, pp. 641–643.

T. Hori, "A 0.1–μm CMOS Technology with Tilt–Implanted Punchthrough Stopper (TIPS)", *International Electron Devices Meeting 1994*, Technical Digest, Dec. 11–14, 1994, pp. 75–78.

*Primary Examiner*—John Niebling
*Assistant Examiner*—Michael S. Lebentritt
*Attorney, Agent, or Firm*—Sughrue, Mion, Zinn,Macpeak & Seas, PLLC

[57] ABSTRACT

A P-type diffusion layer for buried channel is formed on the surface of N-well immediately below a gate electrode, then a side wall spacer is formed at the side surface of the gate electrode. Subsequently, with taking the gate electrode and the side wall spacer as mask, phosphorous ion is implanted to the N-well by oblique rotating ion implantation and boron fluoride ion is implanted by perpendicular ion implantation. Then, phosphorous ion and boron fluoride ion are activated by heat treatment to form high density P-type diffusion layer and P-type diffusion layer for buried channel.

6 Claims, 7 Drawing Sheets

FABRICATION PROCESS FOR MOSFET USING OBLIQUE ROTATION ION IMPLANTATION

BACKGROUND OF THE INVENTION

1. Field of the Invention

The present invention relates generally to a fabrication process for a MOSFET. More specifically, the invention relates to a fabrication process for a short-channel MOSFET.

2. Description of the Related Art

In a P-channel MOSFET having a P-type diffusion layer for a buried channel, it has been known to form N-type diffusion layer for guarding, between a buried channel layer and a high density P-type diffusion layer for source and drain, in order to prevent punch through of the P-channel MOSFET. A fabrication process of a CMOS semiconductor device including such P-channel MOSFET has been disclosed in Japanese Examined Patent Publication (Koukoku) No. Heisei 6-3808, for example.

In the conventional fabrication process of the CMOS semiconductor device, disclosed in the above-identified publication, N-well and P-well are formed in parallel on the surface of a P-type silicon substrate, at first. On the surface of the N-well and the P-well, a field oxide layer to be a device isolation region is formed by selective oxidation with taking a silicon nitride layer as a mask. On the other hand, in an element forming region between the field oxide layers, a gate oxide layer is formed. Next, on the surface of N-well, in a region at least immediately below a gate electrode, a P-type diffusion layer for a buried channel is formed by ion implantation of a P-type impurity. Before and after formation of the P-type diffusion layer, the gate electrode of N-type polycrystalline silicon layer is formed.

Next, with taking the gate electrode as a mask, ion implantation of a N-type impurity is performed on the surface of the element forming region in the N-well and the P-well. By this, an N-type diffusion layer for guarding is formed on the surface of the N-well. On the other hand, on the surface of the P-well, low density N-type diffusion layer for LDD for N-type source and drain is formed simultaneously. Then, a silicon oxide layer covering at least the side surface of the gate electrode is formed. With taking the silicon oxide layer and the gate electrode and so forth as a mask, ion implantation of a P-type impurity and an N-type impurity is performed on the surfaces of the N-well and the P-well, respectively. Thereafter, heat treatment is performed. By this, high density P-type diffusion layers for P-type source and drain are formed on the surface of the N-well. On the other hand, high density N-type diffusion layers for N-type source and drain are formed on the surface of the P-well.

The inventor has made a study for modifying the fabricating condition of the semiconductor device disclosed in the embodiment of the above-identified publication adapting to fabrication of CMOS having a short channel of sub-micron, and whether the fabrication process of the semiconductor device with the modified fabricating condition is applicable for fabrication of the CMOS with the short channel of sub-micron.

Figure 1A:
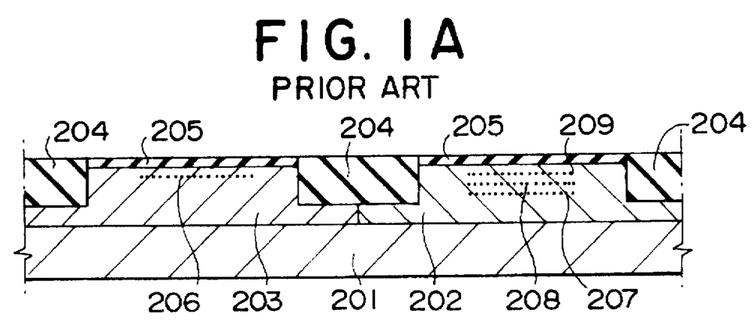
FIGS. 1A to 1D are diagrammatic sections showing the conventional fabrication process of a semiconductor device, showing process steps in order.

FIGS. 1A to 1D and 2 are diagrammatic sections showing process steps of fabrication process of short channel CMOS in order, as modified fabrication process disclosed in the above-identified publication. As shown in FIG. 1A, in a predetermined region of P-type silicon substrate 201 of $1 \times 10^{15}$ cm$^{-3}$ of impurity concentration, ion implantation of $1 \times 10^{13}$ cm$^{-2}$ of phosphorous (P) ion is performed at an energy of 150 keV and ion implantation of $4 \times 10^{13}$ cm$^{-2}$ of boron (B) ion is performed at an energy of 30 keV, with taking a photoresist layer as a mask. Subsequently, a heat treatment is performed at a temperature of 1200° C. for 150 minutes to form N-well 202 and P-well 203.

In an isolation region on the P-type silicon substrate 201, a field oxide layer 204 is formed by selective oxidation. On the other hand, in order to prevent contamination upon ion implantation, in the element forming region in the surface of the P-type silicon substrate 201, a silicon oxide layer 205 in a thickness of 9 nm is formed by thermal oxidation. In order to obtain a required level of threshold voltage in the N-channel MOSFET, ion implantation of $3 \times 10^{12}$ cm$^{-2}$ of boron ion 206 is performed at an energy of 30 keV on the surface of the P-well 203. On the other hand, in order to prevent punch through between the source and drain of the P-channel MOSFET, and in conjunction therewith, to obtain the required level of threshold voltage, an ion implantation of $2 \times 10^{12}$ cm$^{-2}$ of phosphorous ion 207 is performed at an energy of 220 keV, ion implantation of $4 \times 10^{12}$ cm$^{-2}$ of arsenic (As) ion 208 is performed at the energy of 240 keV, and ion implantation of $4 \times 10^{12}$ cm$^{-2}$ of boron fluoride (BF$_2$) ion 209 is performed at an energy of 35 KeV, on the surface of the N-well 202.

Figure 1B:
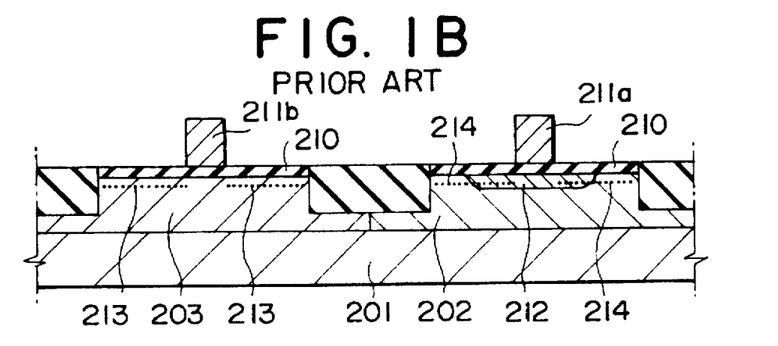

Subsequently, the silicon oxide layer 205 formed on the surface of the N-well 202 and the P-well 203 is removed and a gate oxide layer 210 in a thickness of 8 nm is formed by thermal oxidation at the portion where the silicon oxide layer 205 is removed in the preceding process step. Then, by way of vapor deposition method, a polycrystalline silicon layer in a thickness of 300 nm is formed over the entire surface. By diffusion of phosphorous in the polycrystalline silicon layer, high density N-type layer is formed. By heat treatment during thermal diffusion, the boron ion 206, the phosphorous ion 207, the arsenic ion 208 and the boron ion 209 are activated. As a result, on the surface of the N-well 202, a P-type diffusion layer 212 for buried channel is formed. On the other hand, by patterning of the high density N-type polycrystalline silicon layer, gate electrodes 211a and 211b of approximately 400 nm width (gate length is approximately 400 nm) are formed. The gate electrode 211a of the P-channel MOSFET is formed of high density N-type polycrystalline silicon layer. From a work function between the N-well 202 and the gate electrode 211a, the aforementioned P-channel MOSFET is of enhancement type. On the other hand, in order to provide a negative threshold voltage (e.g. −0.6V), it becomes inherent to provide the P-type diffusion layer 212 for the buried channel.

With taking the gate electrodes 211a and 211b as mask, ion implantation of phosphorous ion 214 and phosphorous ion 215 in the order of $2 \times 10^{13}$ cm$^{-2}$ is performed at an energy of 20 keV, on the surfaces of the N-well 202 and the P-well 203, respectively.

Figure 1C:
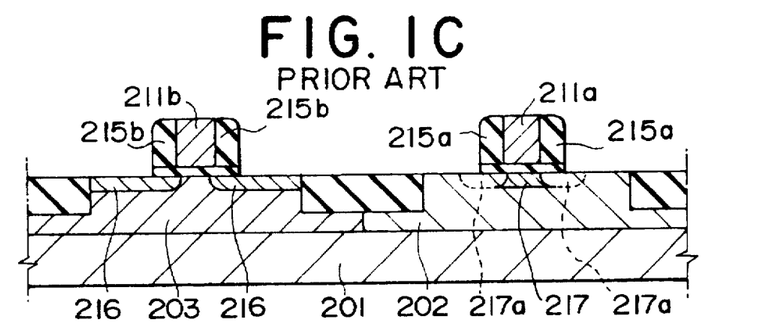

Next, by low temperature CVD method, a silicon oxide layer of 110 nm in thickness is deposited over the entire upper surface of the substrate 201. Then, by way of an anisotropic reactive ion etching (RIE), the silicon oxide layer is etched back. Then, as shown in FIG. 1C, only silicon oxide layer remains on the side surfaces of the gate electrodes 211a and the 211b to form a side wall spacer 215a and 215b. Subsequently, by performing heat treatment, the phosphorous ion 213 is activated on the surface of the P-well 203 to form the low density N-type diffusion layer 216 for LDD is formed. On the other hand, on the surface of the N-well 202, by activation of the phosphorous ion 214, the P-type diffusion layer 212 for buried channel is canceled except for the portion immediately below the gate electrode 211a. Namely, the P-type diffusion layer 217 for buried channel only at the portion immediately below the gate electrode 211a is remained and the region 217a of the P-type diffusion layer is partially erased.

Figure 1D:
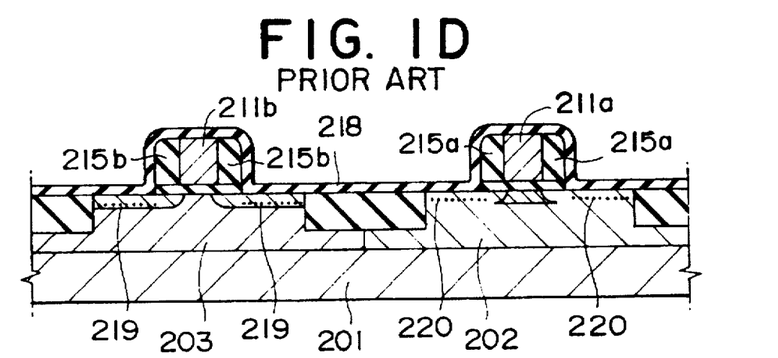

Thereafter, by way of low temperature CVD method for preventing contamination in ion implantation, as shown in FIG. 1D, a silicon oxide layer 218 in the order of 10 nm in thickness is again deposited over the entire surface of the substrate 201. Then, after covering the surface of the N-well 202 with the photoresist layer, with taking the photoresist layer, the gate electrode 211b and the side wall spacer 215b as mask, $2 \times 10^{15}$ cm$^{-2}$ arsenic ion 219 is implanted at the energy of 70 keV on the surface of the P-well 203 in the direction perpendicular thereto. Then, after removing the photoresist layer, the surface of the P-well 203 is covered with another photoresist layer. With taking the photoresist layer, the gate electrode 211a and the side wall spacer 215a as a mask, ion implantation of $5 \times 10^{15}$ cm$^{-2}$ of boron fluoride ion 220 is performed perpendicularly to the surface of the N-well 202 at an energy of 50 keV.

Figure 2:
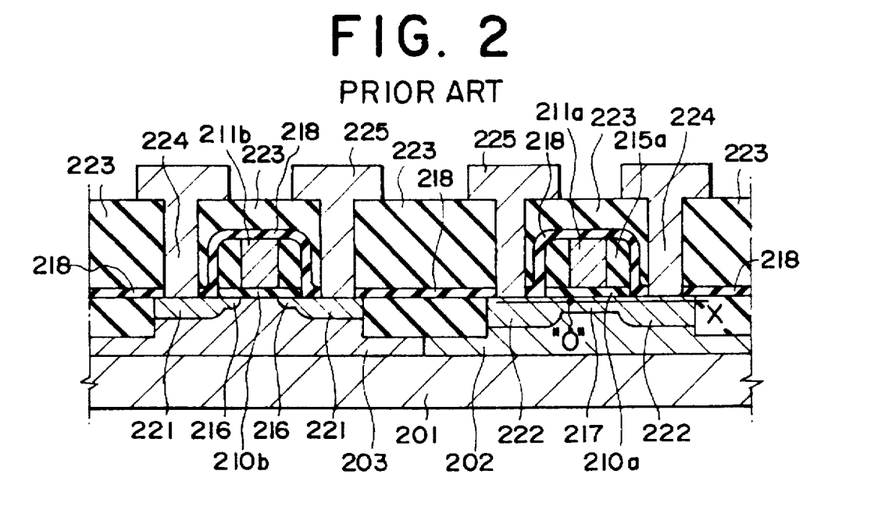
FIG. 2 is a diagrammatic section showing the conventional semiconductor device.

Then, by heat treatment at a temperature of 850° C. for 30 minutes, the arsenic ion 219 and the boron fluoride ion 220 are activated. Therefore, the high density N-type diffusion layer 221 for source and drain of the N-channel MOSFET and the high density P-type diffusion layer 222 for source and drain of the P-channel MOSFET are formed as shown in FIG. 2. The depth of the junction of the N-type diffusion layer 221 and the P-type diffusion layer 222 are respectively about 150 nm and about 250 nm.

Thereafter, an interlayer insulation layer 223 of silicon oxide layer is formed over the entire upper surface of the substrate 201 by low temperature CVD method. Then, through the interlayer insulation layer 223 and the silicon oxide layer 218, a plurality of contact holes 224 reaching the N-type diffusion layer 221 and the P-type diffusion layer 222 are formed. Then, in each contact hole 224, an aluminum wiring 225 connected to the N-type diffusion layer 221 and the P-type diffusion layer 222 is formed to complete the CMOS fabrication.

It should be noted that the reason why the silicon oxide layer constituting the side wall spacers 215a and 215b, the silicon oxide layer 218 and the interlayer insulation layer 223 are formed by low temperature CVD method, is to restrict short channel effect of the P-channel MOSFET and not to make the depth of the junction with the P-type diffusion layer 217 excessively deep.

When the silicon oxide is formed by CVD method, in the current technology, the thickness of the silicon oxide layer may fluctuate in a range of about ±10% with respect to the desired layer thickness. Therefore, the width $L_{sw}$ of the side wall spacer is inherently fluctuated in a range of about ±10%.

On the other hand, the density distribution of impurity in the horizontal direction in the high density P-type diffusion layer 222 for source and drain of the P-channel MOSFET and the P-type diffusion layer 217 for buried channel, shown in FIG. 2, becomes as follows. It should be noted that in the P-type diffusion layer 217 in the vicinity of an interface between a gate oxide layer 210a and the N-well 202 of the P-channel MOSFET, shown in FIG. 2, a position immediately below the left side end of the gate electrode 211a is taken as an origin (O), and the position in the horizontal direction is assumed as X (nm).

Figure 3:
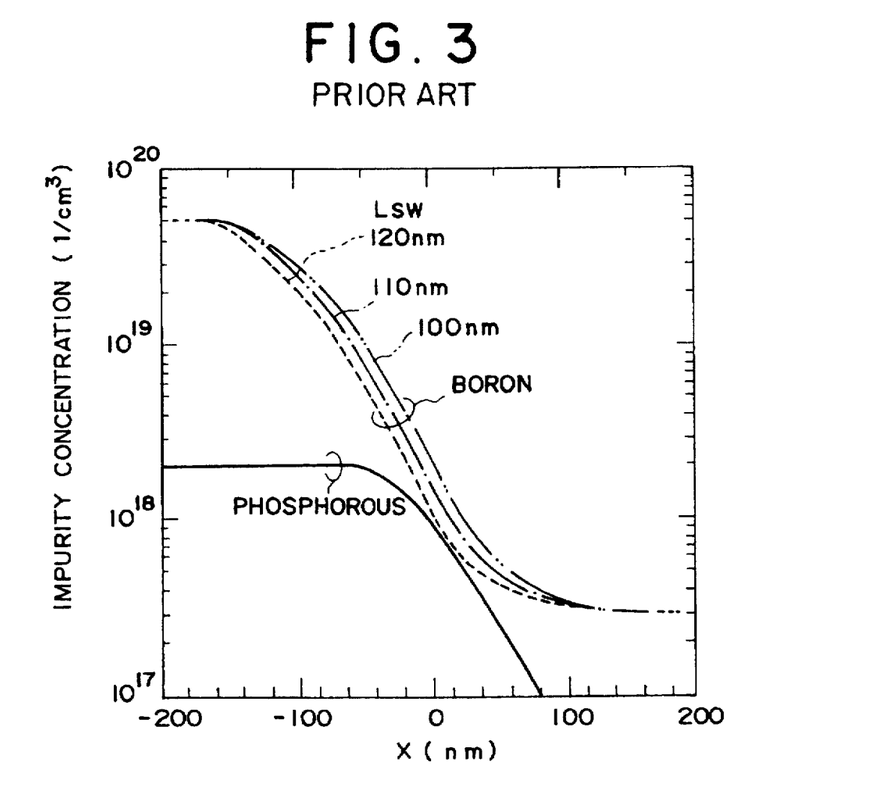
FIG. 3 is an illustration for explaining problems in the conventional fabrication process of the semiconductor device and is a graph showing a distribution of concentration of impurity (phosphorous and boron) in the vicinity of the position immediately below the end of the gate electrode.

FIG. 3 is a graph showing impurity concentration (boron and phosphorous concentrations) in the vicinity of the origin (O) in the high density P-type diffusion layer 222 and the P-type diffusion layer 217 for buried channel shown in FIG. 2, wherein the horizontal axis represents the horizontal position and the vertical axis represents impurity concentration.

At first, concerning phosphorous ion 214 implanted in the N-well 202 after formation of the gate electrode 211a shown in FIG. 1B, since ion implantation is performed with taking only gate electrode 211a of the P-channel MOSFET as a mask as set forth above, the phosphorous concentration will not be affected by fluctuation of the width $L_{sw}$ of the side wall spacer 215a.

But in attempt for fabricating the semiconductor device with setting the width $L_{sw}$ of the side wall spacer 215a at 110 nm, the width $L_{sw}$ fluctuates in a range of ±10 nm. Therefore, the boron concentration in the vicinity of a boundary between the high density P-type diffusion layer 222 for source and drain shown in FIG. 2, which is formed by ion-implantation of boron fluoride ion 220 with taking the gate electrode 211a and the side wall spacer 215a shown in FIG. 1D as mask and activation thereof, and P-type diffusion layer 217 for buried channel is fluctuated by the width $L_{sw}$ of the side wall spacer 215a as shown in FIG. 3.

Figure 4:
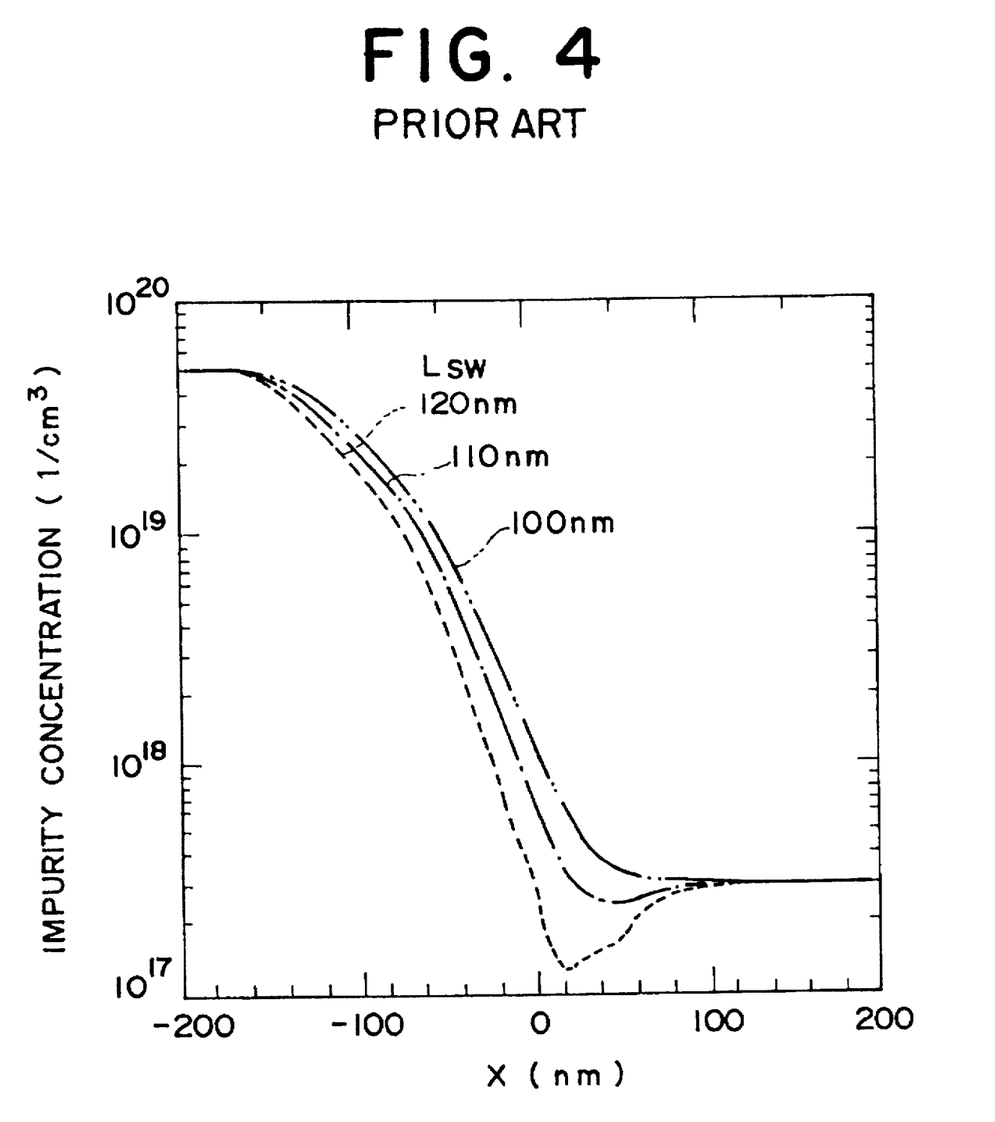
FIG. 4 is an illustration for explaining problems in the conventional fabrication process of the semiconductor device and is a graph showing a distribution of concentration of boron in the vicinity of the position immediately below the end of the gate electrode.

FIG. 4 is a graph showing a concentration distribution of effective boron (P-type impurity) considered with canceling phosphorous (N-type impurity) shown in FIG. 3. As shown in FIG. 4, when the width $L_{sw}$ of the side wall spacer is 120 nm, in the vicinity of X=20 nm, the boron concentration is lowered from the concentration of the channel region. Therefore, a parasitic resistance $R_{SD}$ between the source and drain becomes large to make an ON current $I_{ON}$ smaller. On the other hand, when the width $L_{sw}$ of the side wall spacer is 100 nm, lowering of the boron concentration is not caused to make the parasitic resistance $R_{SD}$ smaller in comparison with the case where $L_{sw}$=120 nm, to make the ON current $I_{ON}$ greater.

Figure 5:
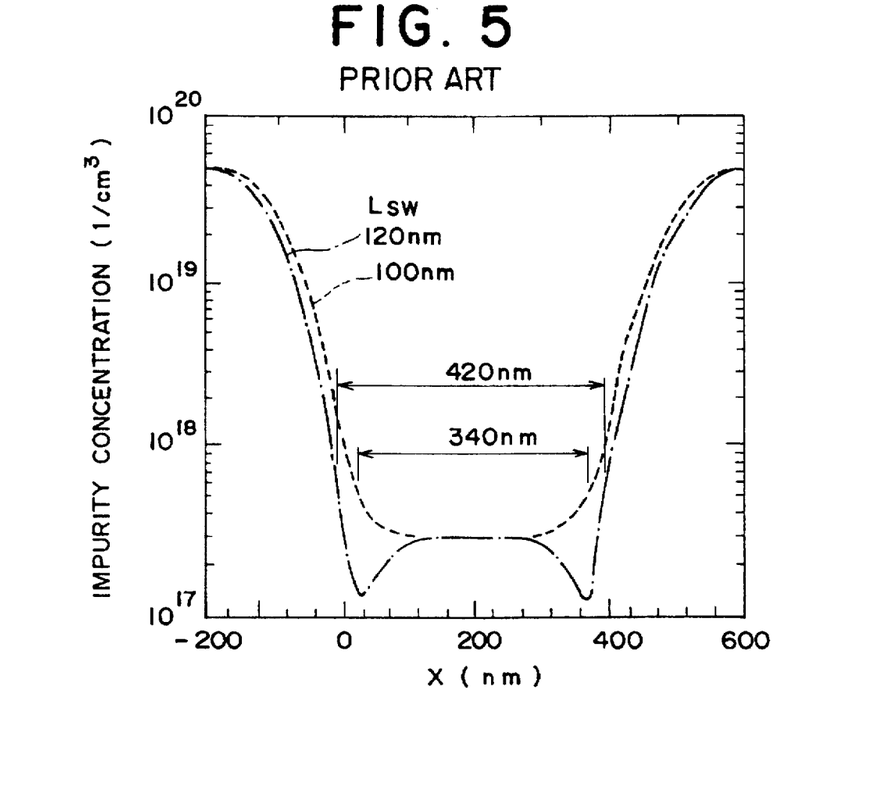
FIG. 5 is an illustration for explaining problems in the conventional fabrication process of the semiconductor device and is a graph showing a distribution of concentration of impurity boron in the vicinity of the position immediately below the end of the gate electrode.

FIG. 5 is a graph showing a distribution of boron concentration in the vicinity with the position immediately below the gate electrode 211a of the P-channel MOSFET shown in FIG. 2. A distance between the source side position and the drain side position to establish $5 \times 10^{17}$ cm$^{-3}$ of the effective boron concentration is defined as an effective channel length $L_{eff}$. Then, as shown in FIG. 5, in the case of P-channel MOSFET of $L_{sw}$=120 nm, $L_{eff}$ becomes 420 nm. On the other hand, in case of the P-channel MOSFET of $L_{sw}$=100 nm, $L_{eff}$ becomes 340 nm. Namely, a difference of the width $L_{sw}$ of the side wall spacer 215a becomes 40 nm (=2×(120−100)), whereas a difference of the channel length $L_{eff}$ becomes 80 nm.

On the other hand, the effective boron concentration at the position immediately below the gate electrode 211a of the P-channel MOSFET affects for parasitic resistance $R_{SD}$ between the source and drain. Namely, in comparison with the case where the width $L_{sw}$ of the side wall spacer 215a is 120 nm, in the case where the $L_{sw}$=100 nm, the concentration of boron at the position immediately below the gate electrode 211a becomes higher and the parasitic resistance $R_{SD}$ between the source and drain becomes lower.

Figure 6:
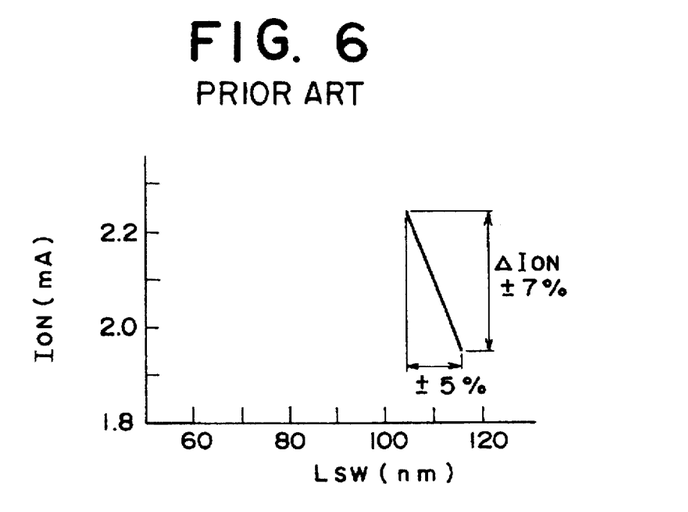
FIG. 6 is an illustration for explaining problems in the conventional fabrication process of the semiconductor device and is a graph showing a fluctuation of ON current with respect to fluctuation of a width of a side wall spacer.

From the results set forth above, as shown in FIG. 6, the fluctuation of the width of the side wall spacer 215a is ±5%, whereas the fluctuation $\Delta I_{ON}$ of the ON current $I_{ON}$ flowing between the source and the drain becomes ±7%.

Also, in the fabrication process of N-channel MOSFET with LDD structure as reported in T. Hori et al., IEEE J. Electron Devices Vol. 39, October 1992, p. 2312 to 2324, the mask for the ion implantation in oblique for forming the N$^{-}$ region is different from the mask for the ion implantation perpendicularly for forming the N⁺ region. Namely, N⁻ ion implantation in oblique is performed with taking the gate electrode as a mask, while N⁺ ion implantation in perpendicular is performed with taking the gate electrode and the side wall spacer as mask. Accordingly, the ON resistance and the ON current of the MOSFET are affected by the width of the side wall spacer.

SUMMARY OF THE INVENTION

It is an object of the present invention to provide a fabrication process of a short-channel MOSFET, which can reduce fluctuation of ON current relative to fluctuation of a width of a side wall spacer formed on the side surface of the gate electrode and formed with an insulation layer.

A fabrication process of a MOSFET according to the present invention, comprises the steps of:

forming a gate oxide layer on a device forming region of a major surface of a silicon substrate having at least an impurity region of one conductive type;

forming a gate electrode on the surface of the gate oxide layer;

forming a side wall spacer made of an insulation layer, on a side surface of the gate electrode;

performing oblique rotation ion implantation of one conductive type impurity with taking the gate electrode and the side wall spacer as mask to form an ion implanted layer of one conductive type at a first depth position from the surface of said impurity region of one conductive type;

performing ion implantation of the other conductive type impurity on the surface of the substrate with taking the gate electrode and the side wall spacer as mask, in a direction perpendicular to said substrate to form an ion implanted layer of other conductive type at a second depth position from the surface of said impurity region of one conductive type, the second depth position being deeper than the first depth position; and activating said ion implanted layer of one conductive type and said ion implanted layer of the other conductive type by heat treatment.

In the present invention, after formation of the side wall spacer on the side surface of the gate electrode, the impurity of one conductive type is implanted by way of oblique rotation ion implantation with taking the gate electrode and the side wall spacer as a mask, and subsequently the impurity of the other conductive type is implanted by perpendicular ion implantation. Therefore, it is possible to avoid lowering of concentration of the other conductive type impurity to that less than the concentration of the channel region at the end portion of the gate electrode by one conductive type impurity and the other conductive type impurity are both affected by the width of the side wall spacer. By this, fluctuation of the effective channel length due to fluctuation of the width of the side wall spacer can be successfully reduced to suppress fluctuation of the ON current.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The preferred embodiment of a fabrication process of a semiconductor device according to the present invention will be discussed hereinafter in detail with reference to the drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 7A:
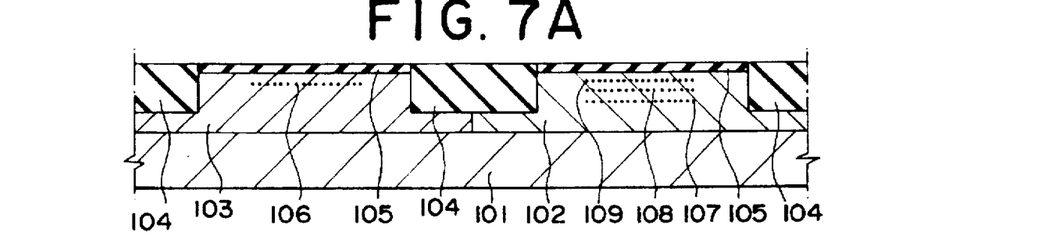
FIGS. 7A to 7D are diagrammatic sections showing the preferred embodiment of a fabrication process of MOSFET according to the present invention, showing process steps in order.

FIGS. 7A to 7D are diagrammatic sections showing the preferred embodiment of a fabrication process of the MOSFET according to the present invention, showing process steps in order. As shown in FIG. 7A, in a predetermined region of a surface of a P-type silicon substrate 101 which has an impurity concentration of, for example, $1 \times 10^{15}$ cm$^{-3}$, ion implantation of $1\times10^{13}$ cm$^{-2}$ of phosphorous (P) ion is performed at an energy of 150 keV and ion implantation of $4\times10^{13}$ cm$^{-2}$ of boron (B) ion is performed at an energy of 30 keV, with taking a photoresist layer as a mask. Subsequently, the substrate is heat treated at a temperature of 1200° C. for 150 minutes, for example, to form N-well 102 and P-well 103. On the surfaces of the N-well 102 and P-well 103, field oxide layers 104 to be isolation regions are formed by selective oxidation. On the other hand, in order to avoid contamination upon ion implantation, in element forming region between field oxide layers 104, silicon oxide layers 105 having a layer thickness of 9 nm are formed by thermal oxidation.

In order to obtain a desired level of threshold voltage in the N-channel MOSFET, ion implantation of $3\times10^{12}$ cm$^{-2}$ of boron ion 106 is performed at an energy of 35 keV on the surface of the P-well 103. On the other hand, in order to prevent punch through between the source and drain of the P-channel MOSFET, and in conjunction therewith, to obtain the desired level of the threshold voltage, an ion implantation of $2\times10^{12}$ cm$^{-2}$ of phosphorous ion 107 is performed at an energy of 220 keV, ion implantation of $4\times10^{12}$ cm$^{-2}$ of arsenic (As) ion 108 is performed at an energy of 240 keV, and ion implantation of $4\times10^{12}$ cm$^{-2}$ of boron fluoride (BF$_2$) ion 109 is performed at an energy of 30 keV, on the surface of the N-well 102.

Figure 7B:
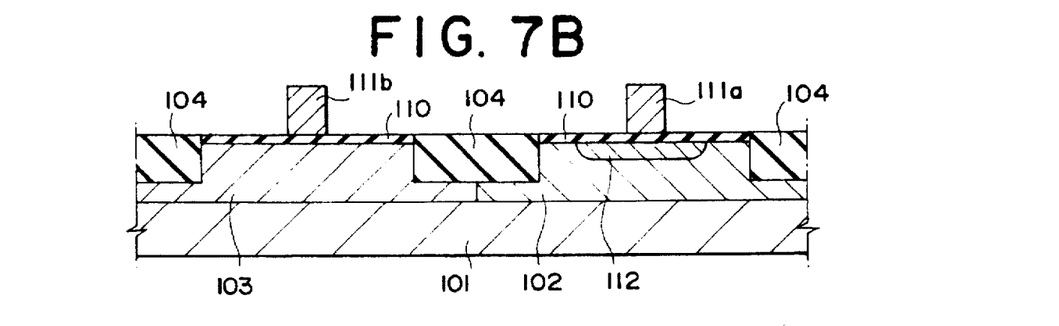

Subsequently, the silicon oxide layers 105 formed on the surface of the N-well 102 and the P-well 103 are removed and gate oxide layers 110 are formed in a thickness of 8 nm by thermal oxidation for the portion where the silicon oxide layers 105 are removed in the preceding process step, as shown in FIG. 7B. Then, by way of vapor deposition method, a polycrystalline silicon layer is formed in a thickness of 300 nm over the entire surface of the field oxide layers 104 and the gate oxide layers 110. By thermal diffusion of phosphorous in the polycrystalline silicon layer, high density N-type layer is formed. By heat treatment during thermal diffusion, the boron ion 106, the phosphorous ion 107, the arsenic ion 108 and the boron fluoride ion 109 are activated. As a result, on the surface of the N-well 102, P-type diffusion layer 112 for buried channel is formed, as shown in FIG. 7B. Subsequently, by patterning of the high density N-type polycrystalline silicon layer, gate electrodes 111a and 111b of approximately 400 nm width (gate length is approximately 400 nm) are formed, as shown in FIG. 7B.

The gate electrode 111a of the P-channel MOSFET is formed of high density N-type polycrystalline silicon layer. From a work function between the N-well 102 and the gate electrode 111a, the P-channel MOSFET is of enhancement type. On the other hand, in order to provide a negative threshold voltage (e.g. −0.6V), it becomes inherent to provide the P-type diffusion layer 112 for the buried channel.

Figure 7C:
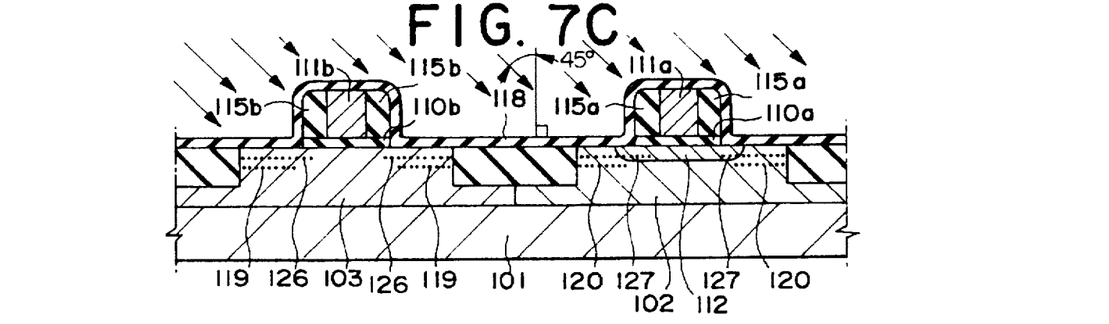

Next, by low temperature CVD method, a silicon oxide layer is deposited in a thickness of 70 nm over the entire upper surface of the substrate 101. Then, by way of RIE, the silicon oxide layer is etched back. Then, as shown in FIG. 7C, silicon oxide layer is remained only on the side surfaces of the gate electrodes 111a and the 111b to form side wall spacers 115a and 115b. Subsequently, by way of low temperature CVD method for preventing contamination in ion implantation, a silicon oxide layer 118 is again deposited in the order of 10 nm in thickness over the entire surface of the substrate 101. Then, after covering the surface of the N-well 102 with the photoresist layer, $8\times10^{13}$ cm$^{-2}$ of phosphorous ion 126 is implanted with taking the photoresist layer, the gate electrode 111b and the side wall spacer 115b as mask by oblique rotation ion implantation to the surface of the P-well 103 at the energy of 40 keV, in a direction inclined for about 45° with respect to the normal direction of the major surface of the substrate 101. Furthermore, with taking the photoresist layer, the gate electrode 111b and the side wall spacer 115b as mask, $2\times10^{15}$ cm$^{-2}$ of arsenic ion 119 is implanted to the surface of the P-well 103 at the energy of 70 keV, in perpendicular direction to the major surface of the substrate 101.

Then, after removing the photoresist layer, the surface of the P-well 103 is covered with another photoresist layer. With taking the photoresist layer, the gate electrode 111a and the side wall spacer 115a as mask, of $8\times10^{13}$ cm$^{-2}$ of phosphorous ion 127 is implanted to the surface of the N-well 102 at the energy of 40 keV by oblique rotation ion implantation method in a direction inclined for about 45° with respect to the normal direction of the major surface of the substrate 101. Also, with taking the another photoresist layer, the gate electrode 111a and the side wall spacer 115a as a mask, ion implantation of $5\times10^{15}$ cm$^{-2}$ of boron fluoride ion 120 is performed to the surface of the N-well 102 at an energy of 50 keV, perpendicularly to the major surface of the substrate 101.

Figure 7D:
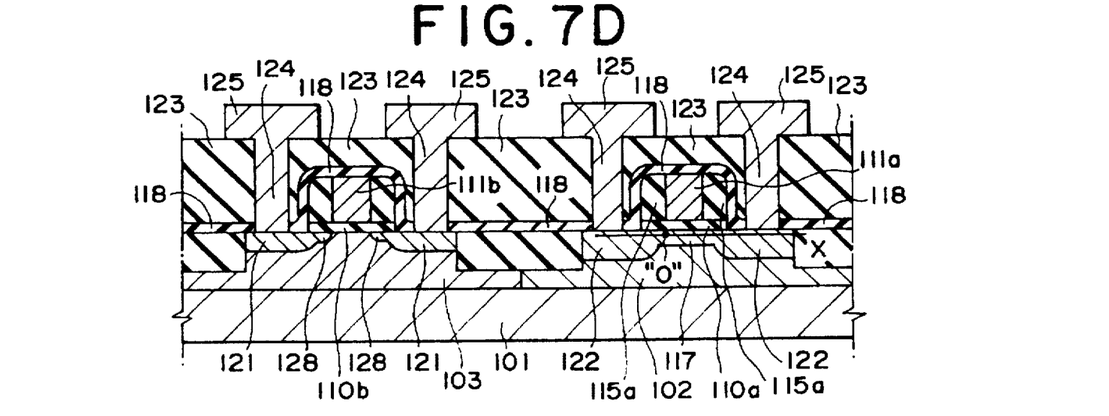

Then, by heat treatment at a temperature of 850° C. for 30 minutes, the arsenic ion 119, the boron fluoride ion 120, the phosphorous ion 126 and the phosphorous ion 127 are activated to form the high density N-type diffusion layer 121 for source and drain of the N-channel MOSFET, the low density N-type diffusion layer 128 for LDD of the N-channel MOSFET and the high density P-type diffusion layer 122 for source and drain of the P-channel MOSFET are formed. The depth of the junction of the N-type diffusion layer 121 and the P-type diffusion layer 122 are about 150 nm and about 250 nm, respectively. On the other hand, the P-type diffusion layer 112 for buried channel of the P-channel MOSFET becomes P-type diffusion layer 117 by interference of phosphorous ion 127 and so forth.

Thereafter, an interlayer insulation layer 123 of silicon oxide layer is formed over the entire upper surface of the substrate 101 by low temperature CVD method. Then, through the interlayer insulation layer 123 and the silicon oxide layer 118, a plurality of contact holes 124 reaching the N-type diffusion layer 121 and the P-type diffusion layer 122 are formed. Then, in each contact holes 124, an aluminum wiring 125 connected to the N-type diffusion layer 121 and the P-type diffusion layer 122 is formed to complete the CMOS fabrication.

It should be noted that the reason why the silicon oxide layer constituting the side wall spacer 115a and 115b, the silicon oxide layer 118 and the interlayer insulation layer 123 are formed by low temperature CVD method, is to restrain short channel effect of the P-channel MOSFET and not to make the depth of the junction between the P-type diffusion layer 117 and the P-type diffusion layer 112 excessively deep.

In the CMOS semiconductor device fabricated as set forth above, the distribution of the impurity concentration in the horizontal direction of high density P-type diffusion layer 122 for source and drain of P-channel MOSFET and the P-type diffusion layer 117 for buried channel become as follows. It should be noted that, in the P-type diffusion layer 117 in the vicinity of the interface between the gate oxide layer 110a and N-well 102 of P-channel MOSFET shown in FIG. 7D, a position immediately below the left side end of the gate electrode 111a is taken as an origin (O), and the position in the horizontal direction is assumed as X (nm).

Figure 8:
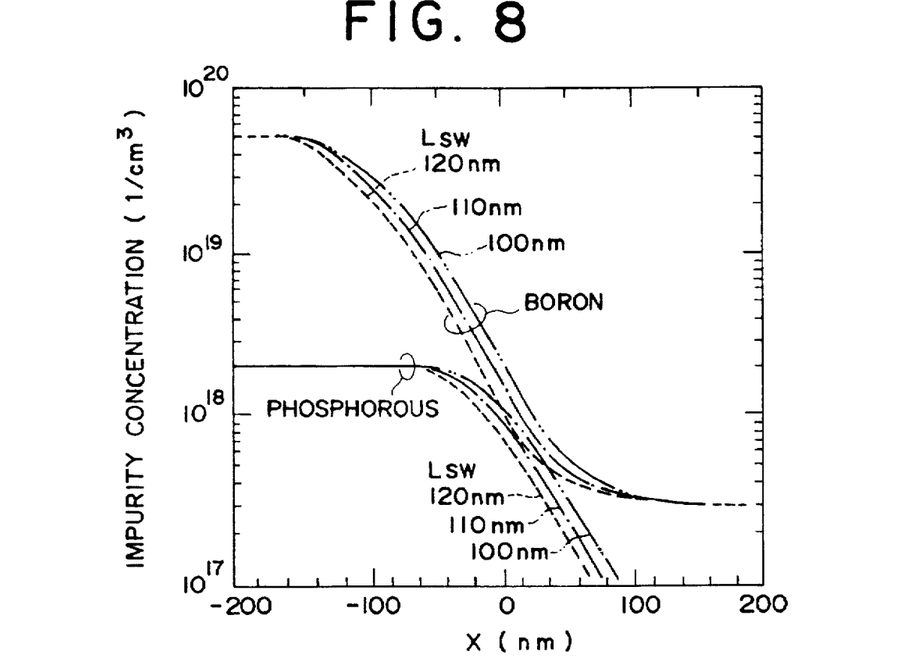
FIG. 8 is an illustration for explanation of effect of the preferred embodiment of the invention, and a graph showing a distribution of concentration of impurity (phosphorous and boron) in the vicinity of the position immediately below the end of the gate electrode.

FIG. 8 is a graph showing impurity concentration (boron a P-type impurity and phosphorous as an N-type impurity in the vicinity of the origin (O) in the high density P-type diffusion layer 122 and the P-type diffusion layer 117 for buried channel shown in FIG. 7D, wherein the horizontal axis represents the horizontal position and the vertical axis represents impurity concentration. The graph shows impurity concentration in the cases that the width $L_{sw}$ of the side wall spacer 115a is 110 nm and 110±10 nm (100 nm and 120 nm).

In the shown embodiment shown, after formation of the gate electrode 111a and the side wall spacer 115a, the phosphorous ion 127 is implanted to the surface of the N-well 102 by oblique rotation ion implantation method, and boron fluoride ion 120 is further implanted to the surface of the N-well 102 perpendicularly thereto. Therefore, as shown in FIG. 8, not only boron ion but also phosphorous ion are implanted to the N-well 102 using a same mask of the gate electrode 111a and the side wall spacer 115a. So, implanted regions of both ions are defined by the same parameter, namely the width $L_{sw}$ of the side wall spacer 115a.

Figure 9:
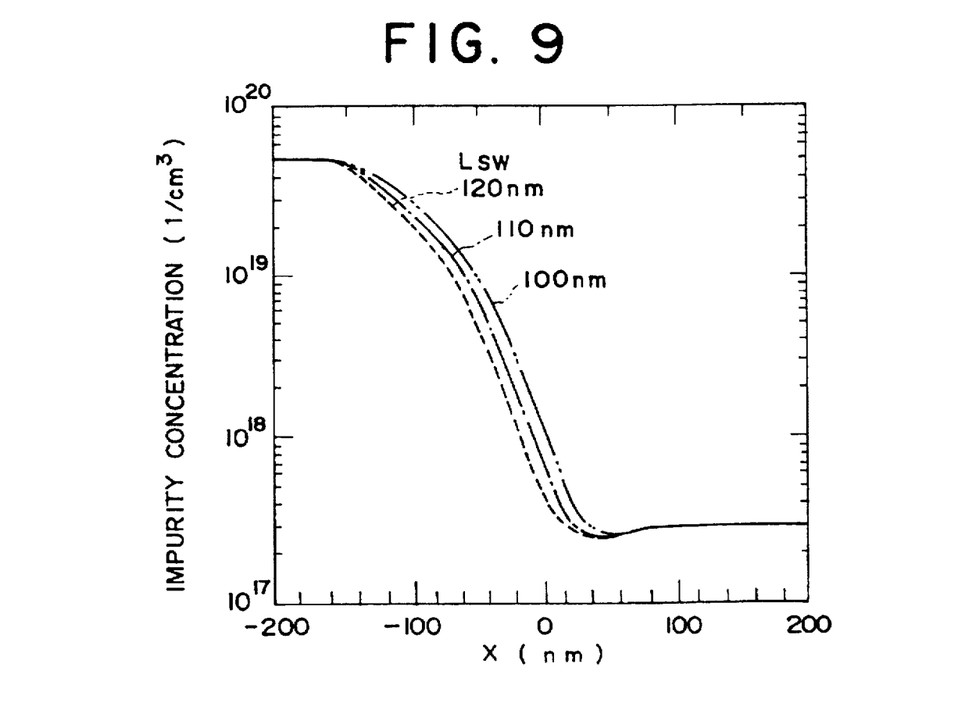
FIG. 9 is an illustration for explanation of effect of the preferred embodiment of the invention, and a graph showing a distribution of concentration of boron in the vicinity of the position immediately below the end of the gate electrode.

FIG. 9 is a graph showing a concentration distribution of effective boron (P-type impurity) considered with canceling effective phosphorous (N-type) shown in FIG. 8. As shown in FIG. 9, even when the width $L_{sw}$ of the side wall spacer 115a fluctuates, boron concentration will not be lowered significantly. Namely, in the conventional fabrication process of the semiconductor device, as shown in FIG. 4, when the width $L_{sw}$ of the side wall spacer 115a is 120 nm, the P-well type impurity (boron) concentration is lowered from the concentration of the P-type diffusion layer 117 of the channel region in the vicinity of X=20 nm. However, according to the embodiment shown of the fabrication process, lowering of the P-type impurity (boron) concentration can be suppressed and fluctuation of boron concentration can be reduced if the fluctuation of the width $L_{sw}$ of the side wall spacer 115a occurs.

Figure 10:
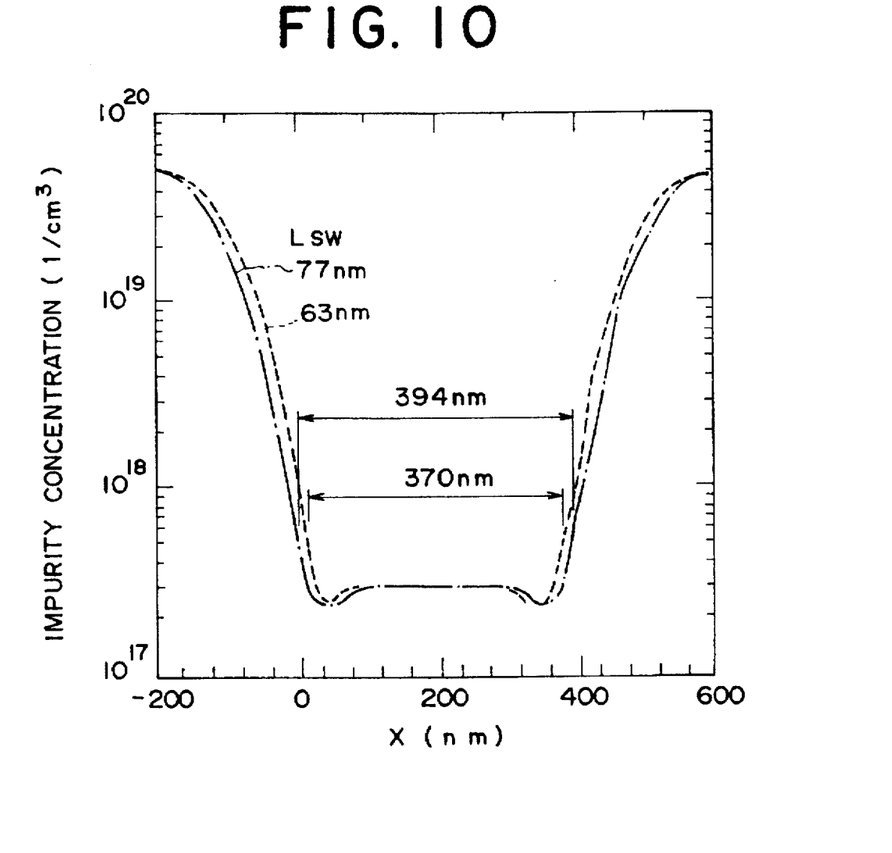
FIG. 10 is an illustration for explanation of effect of the preferred embodiment of the invention, and a graph showing a distribution of concentration of boron in the vicinity of the position immediately below the gate electrode.

Next, discussion will be given in the case where the width $L_{sw}$ of the side wall spacer 115a is 70 nm. In attempt for fabricating the semiconductor device with setting the width $L_{sw}$ of the side wall spacer 115a at 70 nm, the width $L_{sw}$ fluctuates in a range of ±10% to be within a range of 63 nm to 77 nm. In this case, the impurity concentration of the P-type diffusion layers 122 and 117 distributes as illustrated in FIG. 10. FIG. 10 is a graph showing impurity concentration (boron concentration) in the region immediately below the gate electrode in the high density P-type diffusion layer 122 and the P-type diffusion layer 117 for buried channel, shown in FIG. 7D, with taking the horizontal position in the horizontal axis and the impurity concentration in the vertical axis. The distance between the source side position and the drain side position to establish $5 \times 10^{17}$ cm$^{-2}$ of the effective boron concentration of the P-channel MOSFET shown in FIG. 7D, is defined as an effective channel length $L_{eff}$. Then, in case of P-channel MOSFET of $L_{sw}$=77 nm, the channel length $L_{eff}$ becomes 394 nm. On the other hand, in case of the P-channel MOSFET of $L_{sw}$= 63 nm, $L_{eff}$ becomes 370 nm. Namely, a difference of the width $L_{sw}$ between the side wall spacers 115a is 28 nm (=2×(77–63)), whereas a difference of the channel length $L_{eff}$ is 24 nm.

Figure 11:
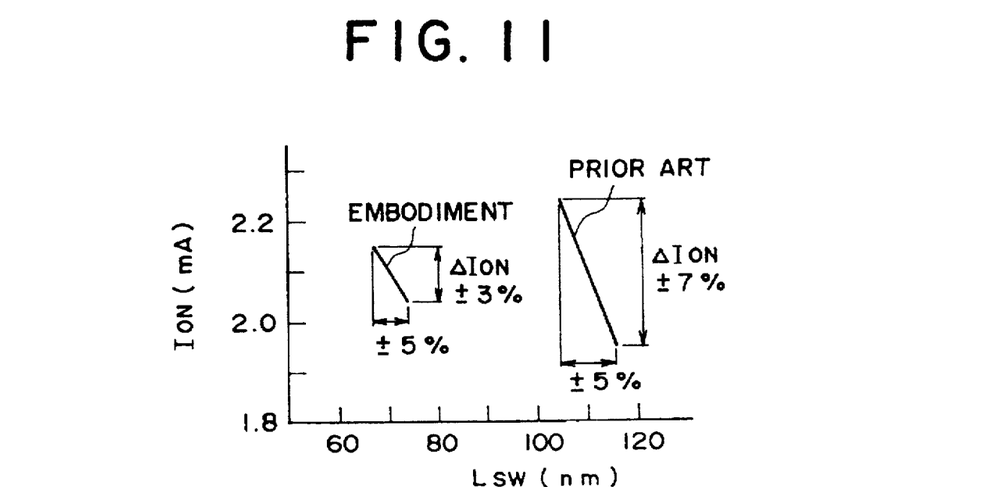
FIG. 11 is an illustration for explanation of effect of the preferred embodiment of the invention, and is a graph showing a fluctuation of ON current with respect to fluctuation of a width of a side wall spacer.

As set forth above, since fluctuation of the impurity concentration of the P-type diffusion layer 112 in the vicinity of the region immediately below the end portion of the gate electrode 111a of the P-channel MOSFET becomes small. Therefore, the parasitic resistance $R_{SD}$ between the source and drain in relation to the fluctuation of the width $L_{sw}$ of the side wall spacer 115a also becomes smaller. As a result, as shown in FIG. 11, while the fluctuation of the width $L_{sw}$ of the side wall spacer 115a is ±5%, the fluctuation $\Delta I_{ON}$ of the ON current $I_{ON}$ becomes ±3%.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

It should be noted that while the foregoing embodiment forms the P-type diffusion layer 117 (P-type diffusion layer 112), the present invention is equally applicable for a surface channel type semiconductor device, namely the semiconductor device having no P-type diffusion layer for buried channel.

On the other hand, while the shown embodiment is applied for the P-channel MOSFET of the short channel, the present invention should not be limited to this. When the short channel N-channel MOSFET employs LDD (or DDD) structure, it becomes not possible to apply the present invention to the N-channel MOSFET. However, when the channel length of the N-channel MOSFET is further shortened and thus the substrate concentration (or impurity concentration at the surface of the P-well) is increased, or, when N-type buried channel (for example, formed by ion implantation of arsenic ion) is required it is effective for lowering N-type impurity concentration of the N-type buried channel immediately below the gate electrode of the N-channel MOSFET for eliminating punch through.

What is claimed is:

1. A fabrication process of a MOSFET which has an impurity region of one conductivity type comprising the steps of:

forming a gate electrode above said impurity region of one conductivity type;

forming a side wall spacer made of an insulation layer, on a side surface of said gate electrode;

performing oblique rotation ion implantation of said one conductivity type impurity using said gate electrode and said side wall spacer as masks to form an ion implanted layer of said one conductivity type which has an impurity concentration higher than that of said impurity region of said one conductivity type, and has a first depth from the surface of said impurity region of said one conductivity type;

performing ion implantation of the opposite conductivity type impurity using said gate electrode and said side wall spacer as masks, in a direction perpendicular to said impurity region of said one conductivity type to form an ion implanted layer of the opposite conductivity type which has an impurity concentration higher than that of said ion implanted layer of said one conductivity type, and has a second depth from the surface of said impurity region of said one conductivity type, the second depth being deeper than said first depth; and activating said ion implanted layer of said one conductivity type and said ion implanted layer of the opposite conductivity type by heat treatment.

2. A fabrication process of a MOSFET according to claim 1, comprising the steps of:

forming a diffusion layer of the opposite conductivity type at the surface of said impurity region of said one conductivity type, before said oblique rotation ion implantation step.

3. A fabrication process of a MOSFET according to claim 2, wherein said one conductivity type is N-type and the opposite conductivity type is P-type, and said step of forming said diffusion layer of the opposite conductivity type comprises steps of:

performing ion implantation of phosphorous ion, ion implantation of arsenic ion and ion implantation of boron fluoride ion to said impurity region of said one conductivity type; and performing heat treatment to form said diffusion layer of the opposite conductivity type.

4. A fabrication process of a MOSFET comprising the steps of:

forming a gate oxide layer on a device forming region of a major surface of a silicon substrate having at least an impurity region of one conductivity type;

forming a gate electrode on the surface of said oxide layer;

forming a side wall spacer made of an insulation layer, on a side surface of said gate electrode;

performing oblique rotation ion implantation of said one conductivity type impurity using said gate electrode and said side wall spacer as masks to form an ion implanted layer of one said conductivity type which has an impurity concentration higher than that of said impurity region of said one conductivity type, and has a first depth from the surface of said impurity region of said one conductivity type;

performing ion implantation of the opposite conductivity type impurity on the surface of said substrate using said gate electrode and said side wall spacer as masks, in a direction perpendicular to said substrate to form an ion implanted layer of opposite conductivity type which has an impurity concentration higher than that of said ion implanted layer of said one conductivity type, and has a second depth from the surface of said impurity region of said one conductivity type, the second depth being deeper than said first depth; and activating said ion implanted layer of said one conductivity type and said ion implanted layer of the other conductivity type by heat treatment.

5. A fabrication process of a MOSFET according to claim 4, comprising the steps of:

forming a diffusion layer of the opposite conductivity type at the surface of said said impurity region of one conductivity type, before said oblique rotation ion implantation step.

6. A fabrication process of a MOSFET according to claim 5, wherein said one conductivity type is N-type and the opposite conductivity type is P-type, and said step of forming said diffusion layer of the opposite conductivity type comprises steps of:

performing ion implantation of phosphorous ion, ion implantation of arsenic ion and ion implantation of boron fluoride ion to said impurity region of said one conductivity type; and performing heat treatment to form said diffusion layer of the other conductivity type.

* * * * *